MONOSTABLE TRANSISTOR CIRCUITS

Filed July 1, 1952

INVENTORS
Arthur W. Lo &
Raymond P. Moore, Jr.

BY H. L. Newton

ATTORNEY

Patented July 7, 1953 2,644,894

UNITED STATES PATENT OFFICE 2,644,894

MONOSTABLE TRANSISTOR CIRCUITS

Arthur W. Lo and Raymond P. Moore, Jr., Haddonfield, N. J., assignors to Radio Corporation of America, a corporation of Delaware Application July 1, 1952, Serial No. 296,585

7 Claims. (Cl. 307—88)

This invention relates generally to triggered circuits, and particularly relates to a monostable transistor circuit employing a single current-multiplication transistor.

Various transistor circuits are known which employ a single current-multiplication transistor to provide either monostable or bistable triggered circuits. A bistable circuit of this type has been disclosed and claimed in the patent to Eberhard 2,533,001. The patent to Rack 2,579,336 discloses and claims a stabilized transistor triggered circuit which may either be monostable or bistable.

The latter patent indicates that available transistors exhibit considerable differences in their characteristics such, for example, as the emitter current vs. emitter voltage characteristic. Many of the prior art transistor triggered circuits require adjustment of the circuit constants to compensate for the different characteristics of each individual transistor. The Rack circuit is intended to overcome this defect by providing substantially zero resistance in the external base circuit during its low current conduction state which, in turn, tends to cause the emitter current-emitter voltage curve to pass through the origin of the coordinates. However, this circuit is comparatively complicated and may still require adjustment of the circuit constants to compensate the differences of the characteristics of individual transistors.

It is an object of the present invention, therefore, to provide a regenerative transistor amplifier or monostable triggered circuit having a high gain and developing an output pulse of a shape which is substantially independent of the amplitude and wave shape of the input or trigger pulse.

Another object of the invention is to provide a monostable transistor circuit of great simplicity and reliability which does not require any adjustment of the circuit constants to compensate for differences of the characteristics of individual transistors.

A further object of the invention is to provide a triggered pulse amplifier circuit employing a single current-multiplication transistor which will develop an output pulse in response to each input or trigger pulse of comparatively small amplitude and which will operate with a high repetition rate of the input pulses.

A monostable triggered circuit in accordance with the present invention comprises a current-multiplication transistor. An external network interconnects the transistor electrodes with a common junction point such as ground and includes a base impedance element and a collector impedance element which serves as the output load. A suitable source of voltage such as a battery is provided between base and collector to bias the collector in the reverse direction with respect to the base. The base impedance element may be a resistor and provides for regeneration as explained in the Eberhard patent referred to.

In accordance with the present invention, the emitter is connected to the common junction point through a capacitor and a source of trigger pulses connected in series. Accordingly, the emitter circuit is substantially open-circuited during the stable state of operation which corresponds to low collector current. Since the emitter circuit is open-circuited, there is substantially zero emitter current flow. The circuit is triggered by the application of an input pulse which preferably has a positive polarity. The trigger pulse will carry the circuit temporarily into its regenerative state corresponding to an instable state of high current conduction. This instable state will exist for a period of time determined by the capacitance of the emitter capacitor and during this time an output pulse is developed across the collector or load resistor.

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1:
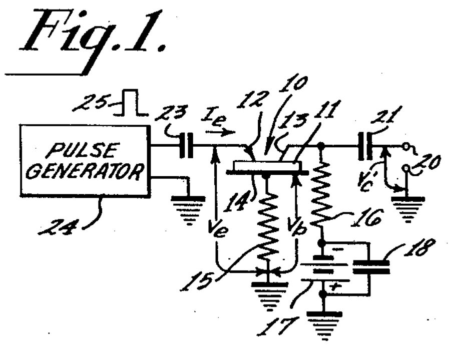
Figure 1 is a circuit diagram of a monostable triggered circuit embodying the present invention.

Referring now to the drawing in which like elements are designated by the same reference characters throughout the figures and particularly to Figure 1 there is illustrated a monostable triggered circuit including a transistor 10. Transistor 10 should be a current-multiplication transistor and may, for example, be a point contact transistor, that is, a transistor of the type where the emitter and collector electrodes are both in rectifying contact with the semi-conducting body 11. The body 11 may consist of a semi-conducting material such as germanium and preferably is of the N type as will be assumed in the following discussion. Emitter 12, collector 13 and base 14 are in contact with body 11. The details of manufacture and the mode of operation of a point contact transistor are well known and need not be further described here.

Base resistor 15 is connected between base 14 and ground. Collector resistor 16 is connected between collector 13 and a suitable source of voltage such as battery 17. Battery 17 is poled to apply a bias voltage in the reverse direction between collector 13 and base 14 and hence, its positive terminal may be grounded while its negative terminal may be connected through collector resistor 16 to collector 13. Battery 17 may be bypassed for alternating frequency currents by bypass capacitor 18. A pair of output terminals 20 is connected across collector or load resistor 16; one of the output terminals 20 may be grounded while the other one is coupled to collector 13 through coupling capacitor 21.

The transistor circuit described so far is conventional. Usually a bias voltage is applied between emitter 12 and base 14. However, in accordance with the present invention, there is no direct current connection between emitter 12 and ground. Instead, the emitter 12 is connected to ground through capacitor 23 and a pulse generator 24 which may, for example, develop positive output pulses indicated at 25. Accordingly, the transistor circuit of Figure 1 is normally, that is, in its stable condition, substantially open-circuited and no direct current bias voltage is applied between emitter 12 and base 14.

Figure 2:
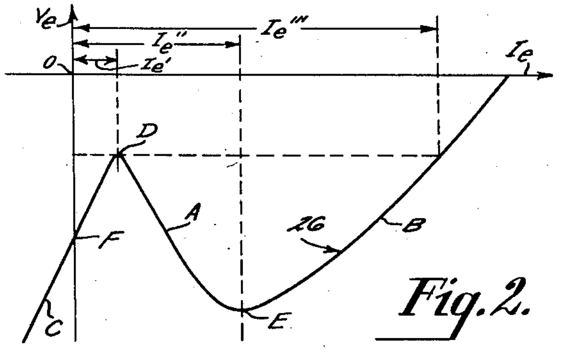
Figure 2 is a graph illustrating the emitter voltage plotted as a function of the emitter current.

The operation of the monostable triggered circuit of Figure 1 may be explained by reference to Figure 2 where the emitter current $I_e$ is plotted against the emitter voltage $V_e$ both being indicated in Figure 1. $V_e$ is taken between emitter and ground. The characteristic curve 26 of Figure 2 essentially resembles the curves shown in the Rack patent above referred to. The characteristic curve 26 has a negative resistance portion A which is bounded on either end by a positive resistance portion B and C respectively. The points D and E are the boundaries between the positive portion C and the negative portion A and between the negative portion A and the positive portion B respectively. The portion of the curve between points D and F (point F corresponding to $I_e=0$) has been exaggerated. The point D corresponds to an emitter current $I_e'$ of approximately 0.05 milliampere and to an emitter voltage $V_e$ of about −1 to −3 volts. However, it will be seen that if the load line of the circuit intersects point F, a stable operation point will be obtained; in accordance with the present invention, this is accomplished.

Since the emitter circuit is substantially open-circuited for the stable state of operation, the load line corresponds substantially to infinite resistance and is represented by $I_e=0$, that is, the vertical axis $V_e$ represents the load line which, of course, intersects the point F of curve 26. This stable state of operation corresponds to a state of low collector current with $I_e=0$. At the same time, the emitter voltage $V_e$ has a negative value.

Let it now be assumed that a positive trigger pulse 25 is applied to the circuit of Figure 1. Accordingly, a current $I_e$ flows between capacitor 23 and emitter 12 as indicated by the arrow in Figure 1. As long as this current is greater than $I_e'$ as shown in Figure 2, the circuit is triggered into its instable condition. The emitter current will now further increase. Since we have assumed that transistor 10 is a current-multiplication transistor, the corresponding increase of the collector current will be larger than that of the emitter current. This large collector current flows through base resistor 15 and the resulting voltage drop will drive the base voltage $V_b$ (see Figure 1) further in a negative direction. Due to the higher negative voltage which is now developed at the base 14, a still larger positive current flows through the emitter capacitor 23 into the emitter 12. Consequently, the emitter current which had a value greater than $I_e'$ due to the trigger pulse suddenly increases to $I_e'''$ as shown in Figure 2 due to this positive feedback action. After the emitter current has increased to $I_e'''$ it decreases again exponentially because the emitter capacitor 23 is charged. Eventually, the emitter current will decrease to a value less than $I_e''$ (Figure 2) and then the circuit rapidly returns again to its stable state of low current conduction at point F because the circuit is unstable within the negative emitter resistance portion A of the curve of Figure 2.

Figure 3:
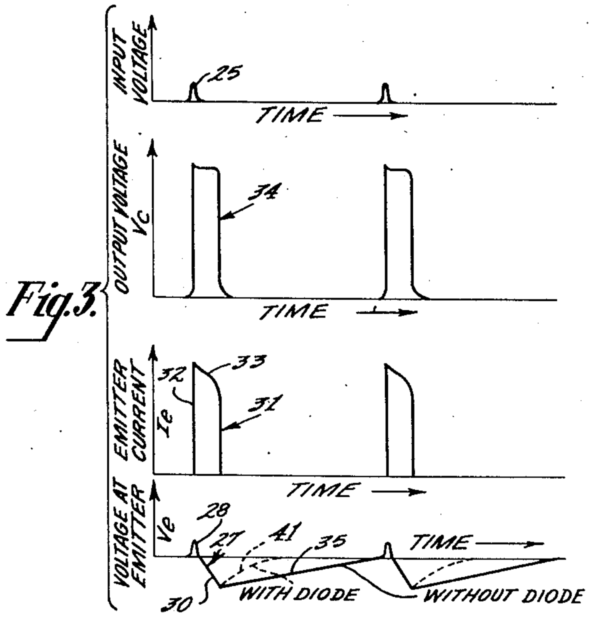
Figure 3 is a graph showing voltages and currents developed at various points of the circuit of Figure 1.

The voltages and currents developed at various points of the transistor are shown more in detail in Figure 3 wherein 25 indicates the trigger pulse impressed on emitter capacitor 23. The corresponding emitter voltage $V_e$ is shown by the curve 27. The positive curve portion 28 corresponds to the trigger pulse 25 which carries the transistor into its regenerative state and subsequently the emitter voltage decreases as indicated by curve portion 30. Curve 31 indicates the corresponding emitter current $I_e$. Curve portion 32 shows a rapid increase of the emitter current which is followed by curve portion 33 indicating an initial relatively slow decrease of the emitter current.

The collector voltage $V_c$ is shown by curve 34 of Figure 3. From the time when $I_e>I_e'$ up to the instant when the emitter current is less than $I_e''$, a high collector current will flow which develops a high voltage across the collector resistor 16. Hence, the width of the output pulse 34 is determined by the capacitance of capacitor 23 for a given transistor. Actually, the width of the output pulse depends on the time constant of the condenser charging circuit which is given by the capacitance of the emitter capacitor 23 and by the external emitter resistance $R_e$ and by the external base resistance $R_b$. This is due to the fact that for the state of high current conduction the internal emitter resistance $R_e$ is low while the internal base resistance $R_b$ may be neglected compared to $R_b$; the resistance of the pulse generator 24 preferably is low.

When the circuit of Figure 1 returns to its stable state, the emitter voltage $V_e$ is still more negative than its quiescent value as shown by curve portion 35. This negative voltage which exists across capacitor 23 must be discharged through a path including the emitter 12, base 14, base resistor 15 and pulse source 24. However, the value of the internal emitter resistance $R_e$ is comparatively high when the transistor is in its low collector current conduction or stable state. Hence, as shown in Figure 3, the curve portion 35 approaches the zero line only after a considerable period of time. Hence, the pulse repetition rate is limited.

Figure 4:
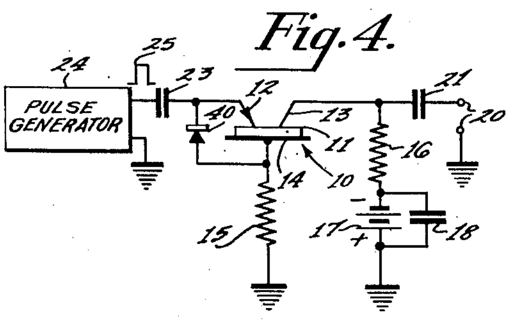
Figure 4 is a circuit diagram of a modified monostable triggered circuit in accordance with the invention.

In accordance with the present invention the discharge time of the capacitor 23 after the triggered circuit has just been carried into the regenerative state and has returned to its normal or stable state may be reduced by the provision of the unilaterally conducting device such as a crystal rectifier 40 shown in Figure 4 which is connected directly between emitter 12 and base 14. Crystal rectifier 40 is connected in such a manner that it is open-circuited or non-conducting as long as emitter 12 is biased in the forward direction with respect to base 14. In other words, if crystal 11 is of the N type, the crystal rectifier 40 is open-circuited when emitter 12 is positive with respect to base 14 and only becomes conducting when emitter 12 is negative with respect to base 14. This will occur after an output pulse 34 has been developed at the collector in response to a trigger pulse 25 because only when the circuit changes from high to low conduction will the base voltage become positive with respect to the emitter voltage. In other words, the negative emitter voltage shown by curve portion 35 may be more rapidly dissipated through crystal rectifier 40 as shown by the dotted curve portion 41 in Figure 3. The operation of the circuit of Figure 4 is otherwise the same as that of Figure 1.

In view of the fact that capacitor 23 is charged and discharged through the pulse generator 24, the resistance of pulse generator 24 between capacitor 23 and ground should be as small as possible. Of course, it will be understood that the resistance of pulse generator 24 only influences the shape of curve portions 35 or 41 of the emitter voltage and hence determines the pulse repetition rate which the circuit of the invention will handle.

It will also be understood that the circuit of the invention may be triggered by an input pulse of negative polarity. However, in that case, the trigger cycle is initiated by the positive going or trailing edge of the input pulse. In other words, the output pulses will be delayed with respect to the input or trigger pulse by the width of the trigger pulse.

Figure 5:
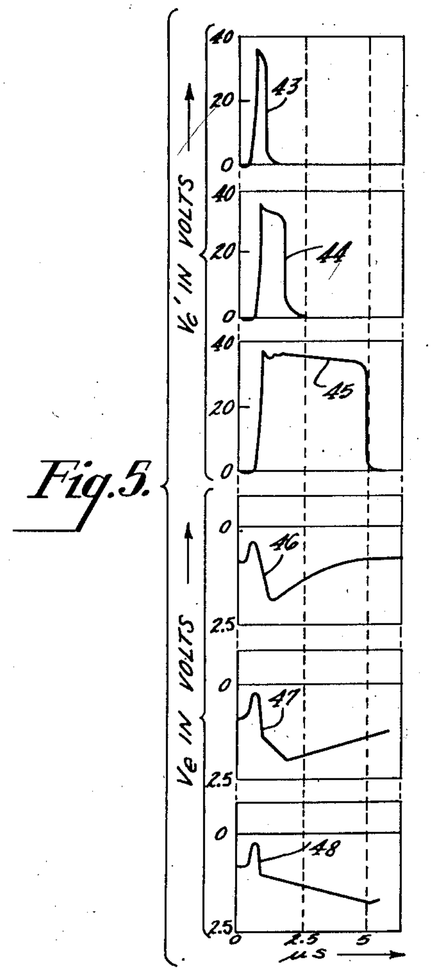
Figure 5 is a graph illustrating the emitter and collector voltages of the circuit of Figure 1 as a function of the capacitance of the emitter capacitor.

Figure 5 illustrates the influence of the capacitance of emitter capacitor 23 on the width of the output pulse. Thus, curves 43, 44 and 45 indicate respectively the shape of the collector voltage $V_c'$ (see Figure 1) when the capacitance of emitter capacitor 23 amounts to 470 micro-microfarads, 2,200 micro-microfarads and 0.01 microfarad. The resistance of base resistor 15 is 2,200 ohms and that of collector resistor 16 is 5,600 ohms for the curves of Figure 5. The voltage of battery 17 is −45 volts. Curves 46, 47 and 48 indicate the emitter voltage $V_e$ for the same respective values of the emitter capacitor 23 as indicated above. As shown by curves 43 to 45, the amplitude of the output pulse is approximately 40 volts. The pulse width of curves 43 to 45 is respectively 0.4, 1.2 and 4.5 microseconds. The output pulse rise time amounts to 0.02 and the output pulse fall time to 0.1 microsecond for curves 43 to 45. The required minimum voltage of the input or trigger pulse is 0.25 volt and the maximum voltage gain 160. The maximum pulse repetition rate which may be used in the circuit of Figure 4 with an emitter capacitor of 470 micro-microfarads, 4,700 micro-microfarads and 0.01 microfarad is respectively 250, 100 and 50 kc.

There has thus been disclosed a monostable triggered circuit which will develop an output pulse of comparatively high amplitude in response to a trigger pulse, the output pulse having a width which is independent of the amplitude or wave shape of the input pulse. The emitter circuit of the monostable transistor network is substantially open-circuited in its stable state of operation and does not have a direct current path nor is a direct current bias voltage applied to the emitter. Hence, no battery is required for the emitter circuit and no power is needed in the emitter circuit in the low conduction state. The monostable triggered circuit of the invention is very simple in construction and does not require adjustment for the varying characteristics of individual transistors. This is due to the fact that the load line of the stable state condition corresponds substantially to an infinite resistance and zero emitter current.

What is claimed is:

1. A monostable triggered circuit comprising a current-multiplication transistor device including a semi-conducting body, a base electrode, an emitter electrode and a collector electrode in contact with said body, an external circuit network interconnecting said electrodes with a common junction point and including a first impedance element connected between said base electrode and said junction point, an output second impedance element connected between said collector electrode and said junction point, means serially connected with said first and second impedance elements for applying a bias voltage in the reverse direction between said collector and base electrodes, a capacitor having one terminal connected to said emitter electrode, and means providing a trigger pulse supplying connection between the other terminal of said capacitor and said junction point, said circuit having a stable state of low current conduction and an instable state of high current conduction, the external emitter circuit being substantially open-circuited during said stable state corresponding to substantially zero emitter current, whereby the application of a trigger pulse carries said triggered circuit temporarily into said instable state for a period of time determined by the capacitance of said capacitor to develop an output pulse across said second impedance element.

2. A triggered circuit as defined in claim 1 wherein said first impedance element is a resistor.

3. A triggered circuit as defined in claim 1 wherein said output second impedance element is a resistor.

4. A triggered circuit as defined in claim 1 wherein said trigger pulse supply connection has a low impedance between said other terminal and said junction point.

5. A triggered circuit as defined in claim 1 wherein a rectifier is connected directly between said emitter and base electrodes, said rectifier being poled to be non-conducting when the voltage between said emitter and base electrodes is in the forward direction.

6. A monostable triggered circuit comprising a current-multiplication transistor including a semi-conducting body, a base electrode, an emitter electrode and a collector electrode in contact with said body, an external network interconnecting said electrodes with a common junction point and including a resistor connected between said base electrode and said junction point, an output impedance element connected between said collector electrode and said junction point, a source of voltage serially connected with said first and second impedance elements for applying a bias voltage in the reverse direction between said collector and base electrodes, a capacitor, a source of trigger pulses connected serially with said capacitor between said emitter electrode and said junction point, and a pair of output terminals coupled across said impedance element, said circuit having a stable state of low current conduction and an instable state of high current conduction, the external emitter circuit being substantially open-circuited during said stable state corresponding to substantially zero emitter current, whereby the application of a trigger pulse carries said triggered circuit temporarily into said instable state to develop an output pulse across said output terminals of predetermined amplitude and of a duration determined by the capacitance of said capacitor.

7. A monostable triggered circuit comprising a current-multiplication transistor including a semi-conducting body, a base electrode, an emitterelectrode and a collector electrode in contact with said body, an external network interconnecting said electrodes with a common junction point and including a resistor connected between said base electrode and said junction point, an output impedance element connected between said collector electrode and said junction point, a voltage source serially connected with said resistor and said impedance element for applying a bias voltage in the reverse direction between said collector and base electrodes, a capacitor, a source of trigger pulses connected serially with said capacitor between said emitter electrode and said junction point, said circuit having a stable state of low current conduction and an instable state of high current conduction, the external emitter circuit being substantially open-circuited during said stable state corresponding to substantially zero emitter current, whereby the application of a trigger pulse carries said triggered circuit temporarily into said instable state for a period of time determined by the capacitance of said capacitor to develop an output pulse across said impedance element, and a rectifier connected directly between said emitter and base electrodes and poled to be conducting only when a voltage in the reverse direction exists between said emitter and base electrodes.

ARTHUR W. LO.
RAYMOND P. MOORE, Jr.

No references cited.